(12) United States Patent
Granger-Jones et al.

(10) Patent No.: US 8,970,278 B2
(45) Date of Patent: Mar. 3, 2015

(54) HIGH POWER FET SWITCH

(75) Inventors: Marcus Granger-Jones, Scotts Valley, CA (US); Christian Rye Iversen, Vestbjerg (DK)

(73) Assignee: RF Micro Devices, Inc., Greensboro, NC (US)

( * ) Notice: Subject to any disclaimer, the term of this patent is extended or adjusted under 35 U.S.C. 154(b) by 37 days.

(21) Appl. No.: 13/095,357

(22) Filed: Apr. 27, 2011

(65) Prior Publication Data

US 2011/0260780 A1     Oct. 27, 2011

Related U.S. Application Data

(60) Provisional application No. 61/328,384, filed on Apr. 27, 2010.

(51) Int. Cl.
    *H03L 5/00*            (2006.01)
    *H03K 17/10*          (2006.01)

(52) U.S. Cl.
    CPC .................................. *H03K 17/102* (2013.01)
    USPC ........................................................ 327/308

(58) Field of Classification Search
    USPC ................................. 327/306, 308; 333/81 R
    See application file for complete search history.

(56) References Cited

U.S. PATENT DOCUMENTS

| | | | |
|---|---|---|---|
| 4,890,077 A | 12/1989 | Sun | |
| 6,803,680 B2 | 10/2004 | Brindle et al. | |
| 7,026,858 B2 * | 4/2006 | Tosaka | 327/427 |
| 7,106,121 B2 * | 9/2006 | Hidaka et al. | 327/308 |
| 7,250,804 B2 | 7/2007 | Brindle | |
| 7,268,613 B2 | 9/2007 | Cranford, Jr. et al. | |
| 7,679,417 B2 * | 3/2010 | Vice | 327/308 |
| 7,843,280 B2 | 11/2010 | Ahn et al. | |
| 7,848,712 B2 * | 12/2010 | Fu et al. | 455/80 |
| 8,044,739 B2 | 10/2011 | Rangarajan et al. | |
| 8,058,922 B2 * | 11/2011 | Cassia | 327/534 |
| 8,093,940 B2 | 1/2012 | Huang et al. | |
| 8,330,519 B2 | 12/2012 | Lam et al. | |
| 2001/0040479 A1 | 11/2001 | Zhang | |
| 2007/0139094 A1 | 6/2007 | Nakatsuka et al. | |
| 2010/0214009 A1 | 8/2010 | Fechner | |

OTHER PUBLICATIONS

Kelly, D. et al., "The state-of-the-art of silicon-on-sapphire CMOS RF switches," 2005 IEEE Compound Semiconductor Integrated Circuity Symposium, Oct. 30-Nov. 2, 2005, pp. 200-203, IEEE.

(Continued)

*Primary Examiner* — Dinh Le
(74) *Attorney, Agent, or Firm* — Withrow & Terranova, P.L.L.C.

(57) ABSTRACT

Described are embodiments of stacked field effect transistor (FET) switch having a plurality of FET devices coupled in series to form an FET device stack. A control circuit provides biasing voltages to the gate, source, and drain contacts of each of the plurality of FET devices to switch the FET device stack to and from a closed state and an open state. In the open state, the gate contacts of each of the plurality of FET devices are biased by the control circuit at the second voltage. To prevent activation in the open state, the control circuit biases the drain contacts and source contacts of each of the plurality of FET devices at the first voltage. The first voltage is positive relative to a reference voltage, such as ground, while the second voltage is non-negative relative to the reference voltage but less than the first voltage.

23 Claims, 7 Drawing Sheets

(56) References Cited

OTHER PUBLICATIONS

Shifrin, M.B. et al., "Monolithic FET structures for high-power control component applications," IEEE Transactions on Microwave Theory and Techniques, Dec. 1989, pp. 2134-2141, vol. 37, No. 12, IEEE.

Tinella, C. et al., "0.13/spl mu/m CMOS SOI SP6T antenna switch for multi-standard handsets," 2006 Topical Meeting on Silicon Monolithic Integrated Circuits in RF Systems, Jan. 18-20, 2006, pp. 58-61, IEEE.

Sonnerat, F. et al., "4G Antenna Tuner Integrated in a 130 nm CMOS SOI Technology", 2012 IEEE 12th Topical Meeting on Silicon Monolithic Integrated Circuits in RF Systems (SiRF), Jan. 16-18, 2012, pp. 191-194.

Non-Final Office Action for U.S. Appl. No. 13/095,302, mailed Oct. 19, 2012, 14 pages.

Final Office Action for U.S. Appl. No. 13/095,302, mailed Feb. 19, 2013, 14 pages.

Non-Final Office Action for U.S. Appl. No. 13/095,302, mailed Jun. 5, 2013, 13 pages.

Non-Final Office Action for U.S. Appl. No. 13/095,410, mailed Nov. 8, 2012, 13 pages.

Final Office Action for U.S. Appl. No. 13/095,410, mailed Feb. 14, 2013, 15 pages.

Advisory Action for U.S. Appl. No. 13/095,410, mailed Jun. 19, 2013, 3 pages.

Final Office Action for U.S. Appl. No. 13/095,410, mailed May 27, 2014, 15 pages.

Final Office Action for U.S. Appl. No. 13/095,302, mailed Nov. 19, 2013, 14 pages.

Non-Final Office Action for U.S. Appl. No. 13/095,410, mailed Feb. 3, 2014, 15 pages.

Advisory Action for U.S. Appl. No. 13/095,302, mailed Feb. 27, 2014, 3 pages.

Non-Final Office Action for U.S. Appl. No. 13/922,337, mailed Mar. 10, 2014, 11 pages.

Examiner's Answer for U.S. Appl. No. 13/095,302, mailed Oct. 15, 2014, 8 pages.

Advisory Action for U.S. Appl. No. 13/095,410, mailed Sep. 25, 2014, 3 pages.

Final Office Action for U.S. Appl. No. 13/922,337, mailed Nov. 4, 2014, 10 pages.

* cited by examiner

HIGH POWER FET SWITCH

RELATED APPLICATIONS

This application claims the benefit of provisional patent application Ser. No. 61/328,384 entitled "SINGLE SUPPLY GROUND, AC COUPLED STACKED HIGH POWER FET SWITCH, SINGLE SUPPLY AC COUPLED STACKED HIGH POWER FET SWITCH, AND SINGLE SUPPLY STACKED HIGH POWER FET SWITCH," filed Apr. 27, 2010, the disclosure of which is hereby incorporated herein by reference in its entirety. This application is related to U.S. Utility patent application Ser. No. 13/095,302, also entitled "HIGH POWER FET SWITCH," filed concurrently with this application on Apr. 27, 2011; and U.S. Utility patent application Ser. No. 13/095,410, also entitled "HIGH POWER FET SWITCH," filed concurrently with this application on Apr. 27, 2011, the disclosure of which is incorporated herein by reference in its entirety.

FIELD OF THE DISCLOSURE

This disclosure relates to field effect transistor (FET) switches and methods of operating the same. More particularly, the disclosure relates to stacked FET switches and methods of operating the same.

BACKGROUND

A prior art stacked field effect transistor (FET) switch 10 connected to an RF line 12 is depicted in FIG. 1. The stacked FET switch 10 has an FET device stack 14 that is formed by a plurality of FET devices 16 coupled in series. Each of the plurality of FET devices 16 includes a drain contact, D, a source contact, S, a gate contact, G, and a body contact, B. When the FET device stack 14 operates in a closed state, the FET device stack 14 presents a low impedance to the RF line 12. This provides a shunt path for a radio frequency (RF) signal 18 to ground. On the other hand, when the FET device stack operates in the open state, a high impedance is presented to the RF line 12 and thus, theoretically, the FET device stack 14 does not conduct any of the time-variant RF signal 18. Of course, in practice, some leakage currents are conducted through the FET device stack 14 during the open state, but generally are low enough so as to be negligible. By stacking the plurality of FET devices 16, the time-variant RF signal 18 can be distributed across the plurality of FET devices 16 of the FET device stack 14 allowing the FET device stack 14 to handle higher voltage RF signals 18.

To provide the appropriate biasing voltages for operating the FET device stack 14, the stacked FET switch 10 includes a prior art control circuit 20 having a DC voltage source 22, a negative voltage generator 24, a plurality of switches 26A, 26B, 26C, 26D, and 26E (referred to collectively as "switches 26"), and a bias control device 28 that controls the switches 26. The bias control device 22 controls the plurality of switches 26 to bias a gate voltage at gate contacts and a body voltage at the body contacts, B, in accordance with Table I below.

| Switch State | Gate Voltage | Body Voltage |
| --- | --- | --- |
| Open State | $-V_{bias}$ | $-V_{bias}$ |
| Transition State 1 | Ground | $-V_{bias}$ |

| Switch State | Gate Voltage | Body Voltage |
| --- | --- | --- |
| Transition State 2 | Ground | Ground |
| Closed State | $+V_{bias}$ | Ground |

The drain and sources contacts, D, S, of the FET devices 16 are biased at ground or possibly at an RF port that provides a reference voltage during both the open state and the closed state. The voltage at the drain and sources contacts, D, S, does not change with respect the reference voltage. However, by biasing the gate contacts, G, at the voltage $-V_{bias}$, the channels of the FET devices 16 are pinched off and a buffer voltage is provided that ensures that the time-variant RF signal 18 does not turn on the plurality of FET devices 16 during the open state. To prevent reverse bias diodes from being formed between the body of each of the plurality of FET devices 16 and the drain and sources of each of the plurality of FET devices 16, the body contacts are also biased at the voltage $-V_{bias}$.

One of the problems with this approach is that it requires a negative voltage generator 24 to maintain the gate contacts, G, at the negative bias voltage $-V_{bias}$ relative to ground during the open state. The negative voltage generator 24 may be implemented using negative charge pumps that add additional complexity to the control circuit 20 and may generate spurs. Furthermore, an additional DC voltage source 22 is required to provide a positive bias, $+V_{bias}$, to the gate contacts, G, and operate the FET device stack 14 in a closed state, which also adds complexity to the control circuit 20. If the negative voltage generator 24 is implemented by the negative charge pumps, the finite output impedance of the negative charge pumps also causes problems during transitions from different states as connections to the gates and body are charged and discharged.

Another problem with the prior art design is that it requires a bias swing of $|2V_{bias}|$ to turn the FET device stack 14 from the open state to the closed state, and vice versa. During steady state operation, the bias voltage $-V_{bias}$, has been selected so that voltage from the time-variant RF signal 18 does not cause the voltage at the gate contacts to exceed the breakdown voltage, given the maximum and minimum voltage peaks of the time-variant RF signal 18. However, transition states are required so that the voltage between the gate contact, G, and the other drain and source contact, D, S, of the FET devices 16 do not exceed the voltage handling capabilities of the FET devices 16 from the open and closed states. Of course this adds additional complexity to the control circuit 20, as switches 26B-26E and/or logic level shifters, are required to provide the appropriate gate and body voltages during each of these states. These switches 26B-26E of control device 28 must be appropriately timed to avoid stressing the FET devices 16 during these transitions.

In addition, another disadvantage of the prior art design is that the body contacts, B, must also be negatively biased if the plurality of FET devices 16 are the type of FET devices that require body biasing. For example, in certain types of FET devices 16, internal reverse bias diodes are activated between the body contact, B, and the drain and source contracts, D, S during the open state that prevent the FET device stack 14 from operating appropriately. If the internal reverse bias diodes are activated and a bias voltage, $-V_{bias}$, is not provided at the body contacts, B during the open state, then the voltage drop from the drain contact, D, to the source contacts, S, of each of the plurality of FET devices 16 would be limited to the voltage of a reverse bias diode, around 0.6 Volts. Thus, the prior art design requires negatively biasing the body contacts, B, to $-V_{bias}$ so that the reverse biased diodes are not reverse biased (or at least are not significantly reverse biased) during the open state. Also, the body contacts, B, must be transitioned back to ground when the FET device stack 14 operates in the closed state. This requires the control circuit 20 to have switches 26C, 26D and for the bias control device 28 to time these switches 26C, 26D appropriately. Other prior art embodiments use floating body designs and may not include body contacts, B and use self-biasing. However, prior art floating body designs suffer from poor linearity.

Accordingly, there is a need to develop a stacked FET switch with a control circuit that does not require excessive bias swings and negative biasing voltages.

SUMMARY

Embodiments in the detailed description describe a stacked field effect transistor (FET) switch having a plurality of FET devices coupled in series to form an FET device stack. In one embodiment, each FET device includes a gate contact, a drain contact, and a source contact. A control circuit provides biasing voltages to the gate, source, and drain contacts of each of the plurality of FET devices to switch the FET device stack to and from a closed state and an open state. During a closed state, the control circuit biases the gate contacts of each of the plurality of FET devices at a first voltage, $+V_{bias}$, relative to a reference voltage, such as ground, so that the FET device stack operates in the closed state. Also, during the closed state, the drain contacts and the source contacts of each of the FET devices may be biased to a second voltage relative to the reference voltage. The second voltage is less than the first voltage, $+V_{bias}$, but is non-negative relative to the reference voltage and in some embodiments may be the same as the reference voltage.

In the open state, the gate contacts of each of the plurality of FET devices are biased by the control circuit at the second voltage. To provide a buffer which prevents the plurality of FET devices from being turned on during the open state, the control circuit biases the drain contacts and source contacts of each of the plurality of FET devices at the first voltage, which again is positive relative to the reference voltage. However, since the gate contacts have been biased to the second voltage, the gate contact of each of the plurality of FET devices appears negatively biased relative to the source and drain contacts.

Accordingly, this provides a voltage buffer that prevents the FET devices from being turned on without actually having to provide a negative bias to the gate contacts relative to the reference voltage. Furthermore, the bias swing is the first voltage minus the second voltage from the open state to the closed state and vice versa at the gate contacts. If the magnitude of the first voltage is $|V_{bias}|$ and the second voltage is ground then the bias swing provided by the control circuit is only $|V_{bias}|$.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The described devices, systems and methods include topologies that reduce biasing swings caused when a stacked field effect transistor (FET) switch transitions from an open state to a closed state and vice versa. Furthermore, no negative charge pumps are required to provide a buffer voltage to the FET devices during the open state.

Figure 1:
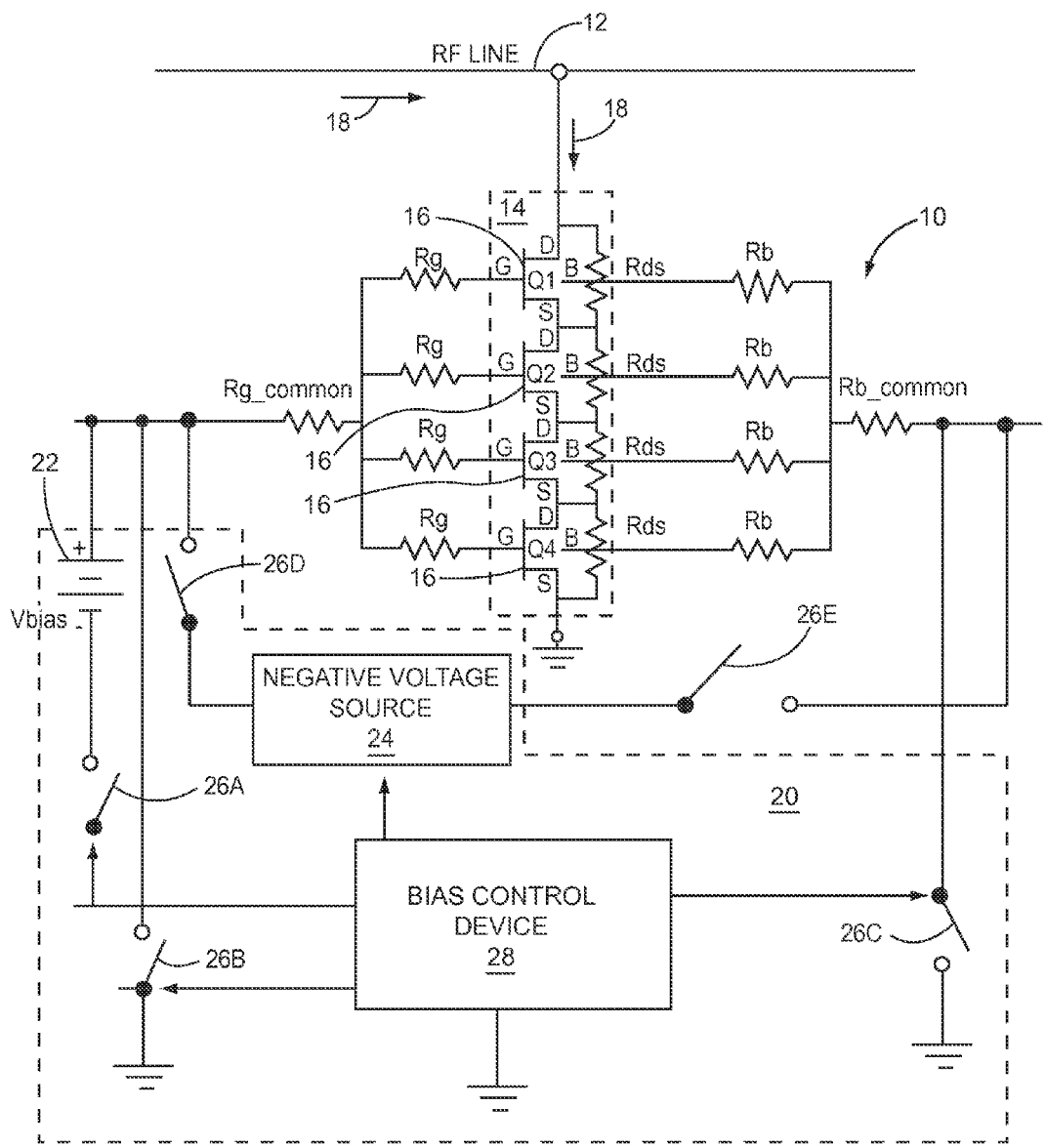
FIG. 1 illustrates a prior art stacked FET switch.
Figure 2:
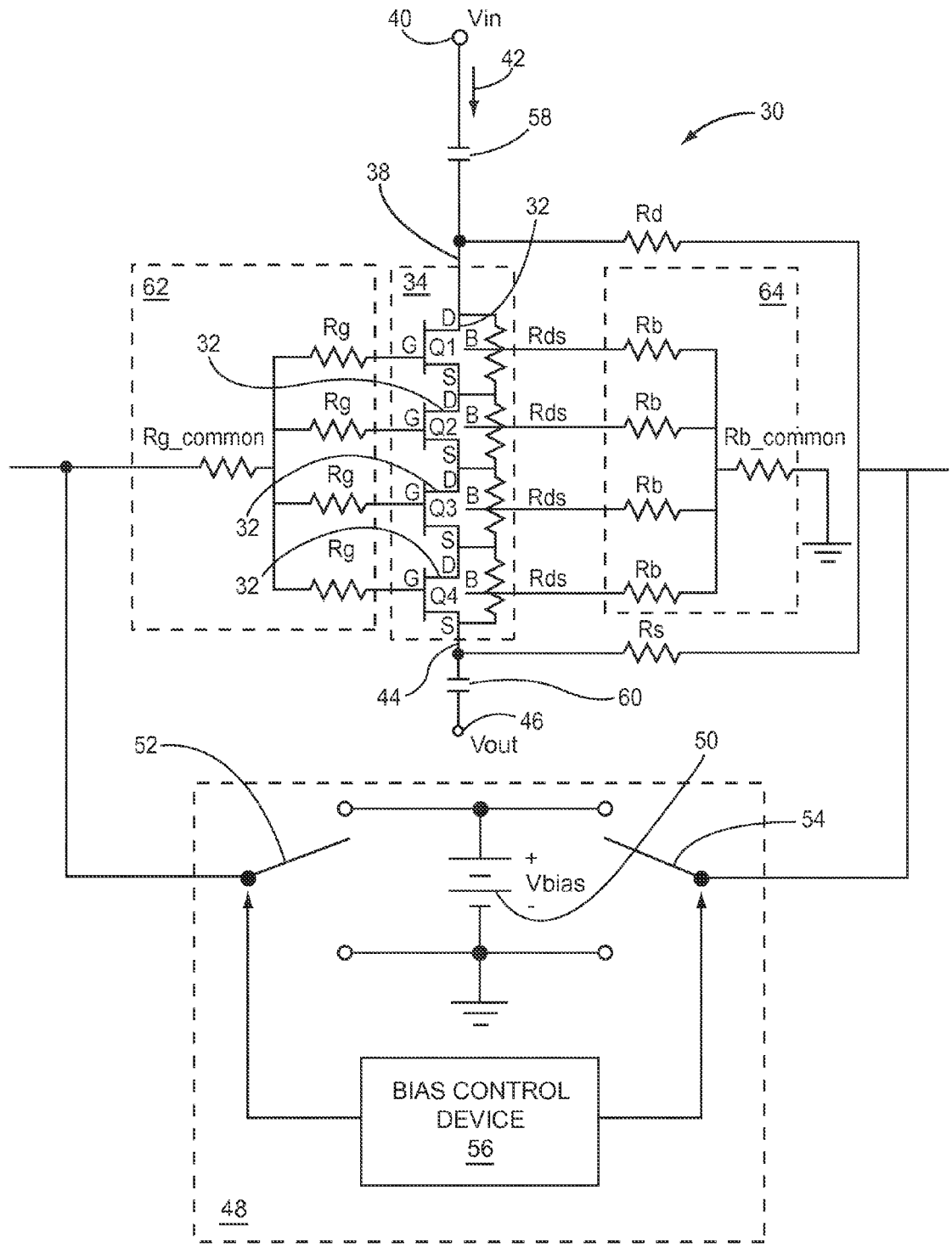
FIG. 2 illustrates one embodiment of a stacked FET switch in accordance with this disclosure.

FIG. 2 illustrates one embodiment of a stacked FET switch 30. The stacked FET switch 30 includes a plurality of FET devices (referred to generically as elements "32" and to a specific FET device as elements $Q_1$-$Q_4$) that are coupled in series to one another to form an FET device stack 34. In this embodiment, the FET device stack 34 has four (4) FET devices 32. However, as explained in further detail below, the FET device stack 34 may have any number of FET devices 32 greater than one (1). Each of the plurality of FET devices 32 has a source, a drain, and a gate. To provide electrical connections to the sources, drains, and gates, each of the plurality of FET devices 32 include source contacts, S, drain contacts, D, and gate contacts, G. In this example, each of the FET devices 32 also includes a body contact, B, to connect to a body of the FET device 32. However floating body embodiments that do not include a body contact, B, and have bodies that are self-biased can also be implemented in accordance with this disclosure.

The plurality of FET devices 32 are coupled in series to form a chain that has a first FET device ($Q_1$), a second FET device ($Q_2$), a third FET device ($Q_3$), and a fourth FET device ($Q_4$). In the illustrated FET device stack 34, the drain contact, D, of the first FET device ($Q_1$) is positioned at the first end 38 of the FET device stack 34 and is coupled to an input terminal 40 for receiving a time-variant input signal 42, such as a radio frequency (RF) signal. At a second end 44 of the FET device stack 34, the fourth FET device ($Q_4$) has a source contact, S, that is coupled to an output terminal 46. In this example, the input terminal 40 and the output terminal 42 are RF ports the FET device stack 34 may be coupled in series in an RF line. The voltages at the input terminal 40 and the output terminal 42 are $V_{In}$ and $V_{out}$. Alternatively, the output terminal 42 may be directly coupled to ground so that the stacked FET switch 30 shunts the RF line.

The FET device stack 34 may be formed, for example, on a silicon-on-insulator (SOI) type substrate, a silicon-on-sapphire (SOS) type substrate, a Gallium Arsenide (GaAs) type substrate, or the like. Each of the plurality of FET devices 32 in the FET device stack may be a complementary metal-oxide-semiconductor (CMOS) type transistor, such as a metal-oxide-semiconductor field effect transistor (MOSFET). The FET devices 32 may also be metal semiconductor field effect transistors (MESFET), a high mobility field effect transistors (HFET), or the like. Utilizing SOI type substrates, SOS type substrates, and GaAs type substrates, may be advantageous in some applications because of the high degree of insulation provided by their internal layers. For example, in an SOI type substrate, the FET devices are formed on a device layer and an insulating layer (also known as a Buried Oxide layer "BOX") may be provided between a handle layer and the device layer. The insulating layer is typically made from an insulating or dielectric type oxide material such as $SiO2$ while the handle layer is typically made from a semiconductor, such as silicon (Si). The degradation in bandwidth normally associated with stacked FET devices 32 and the increased parasitic capacitances of the extra components is reduced by utilizing SOI, SOS, or GaAs type substrates and through other techniques provided in this disclosure for suppressing the loading effects of these parasitic capacitances. However, SOI type substrates, SOS type substrates, and GaAs type substrates are not required and the particular substrate utilized to form the plurality of FET devices 32 should be determined in accordance with factors considered to be important for the particular desired application, such as, a required bandwidth response, distortion tolerances, cost, and the like. Note that the sources and drains between one of the plurality of FET devices 32 and another one of the plurality of FET devices 32 may be independent of one another or may be merged into a single drain/source having drain and source contacts, D, S for each FET device 32.

During an open state of the FET device stack 34, the plurality of FET devices 32 are off and the FET device stack 34 presents a high impedance between the first end 38 and the second end 44. Consequently, very little current, if any, is transmitted from the FET device stack 34 to the output terminal 46. On the other hand, in the closed state, the plurality of FET devices 32 have a low impedance and thus transmits the time-variant input signal 42 to the output terminal 46.

To switch the FET device stack 34 between the open state and the closed state, the stacked FET switch 30 has a control circuit 48 that is operably associated with the FET device stack 34. In this embodiment, the control circuit 48 has a DC voltage source 50, a first switch 52, a second switch 54, and a bias control device 56. The first switch 52 and the second switch 54 may be any type of suitable switch for providing the desired bias voltages. For example, the first switch 52 and second switch 54 may be transistor switches or inverters. The control circuit 48 is connected to each of the gate contacts, G, the drain contact, D, of the first FET device ($Q_1$) at the first end 38 of the FET device stack 34, and the source contact, S, of the fourth FET device ($Q_4$) at the second end 44 of the FET device stack 34. To place the FET device stack 34 in the closed state, the control circuit 48 biases the gate contacts, G, of each of the plurality of FET devices 32 at a first voltage, $+V_{bias}$, relative to a reference voltage. In this example, the reference voltage is $V_{out}$, which is biased externally to ground and thus the reference voltage is ground. In alternative embodiments, the reference voltage may be at other voltage levels depending on the design requirements of the stacked FET switch 30. If the plurality of FET devices 32 are depletion mode type FET devices 32, the plurality of FET devices 32 have a reverse biased pinch-off voltage ($-V_p$). Since the first voltage, $+V_{bias}$, is positive relative to the reference voltage (ground in this case) and has a magnitude greater than a reverse biased pinch-off voltage, $(-V_p)$, the plurality of FET devices 32 are turned on by the first voltage, $+V_{bias}$. For a depletion-mode type FET device 32, the pinch-off voltage $(-V_p)$ is the voltage at the gate contact, G, relative to a voltage of the source contact, S, at which a channel of the FET device 32 is pinched off. In other words, if a reverse bias greater than the pinch-off voltage, $(-V_p)$, is applied between the gate contact, G, and the source contact, S, of the FET device 32, the FET device 32 is turned off and placed in the open state. On the other hand, the plurality of FET devices 32 may also be enhancement mode type FET devices 32. In this case, a forward-biased pinch-off voltage, $(+V_p)$, (also known as a threshold voltage) is required to turn on the channel of the FET device 32. As a result, if a forward bias less than the pinch-off voltage, $(+V_p)$, is applied between the gate contact, G, and the source contact, S, of the enhancement mode type FET device 32, the enhancement mode FET device 32 is turned off and placed in the open state. Accordingly, the FET devices 32 are placed in the closed state by the first voltage, $+V_{bias}$, because the first voltage is greater than the pinch-off voltage, $(+V_p)$ or $(-V_p)$ depending on the type of FET device 32.

In the illustrated embodiment of FIG. 2, the plurality of FET devices 32 are the same type of FET device 32 and have essentially the same characteristics. For example, the FET devices may all be considered to have relatively the same reverse biased pinch-off voltage, $(-V_p)$. It should be noted that this is not required. In other embodiments, each or some of the plurality of FET devices 32 may be of different types and have different characteristics. In these alternative embodiments, the first voltage, $+V_{bias}$, should be selected accordingly to provide the appropriate voltage for the channels of each of the FET devices 32 and place FET device stack 34 in the closed state.

The control circuit 48 of FIG. 2 is connected to bias the drain contact, D and the source contact, S, of each of the plurality of FET devices 32. In this embodiment, the control circuit 48 is connected to apply the bias from the control circuit 48 at the drain contact, D of the first FET device ($Q_1$) and the source contact, S, of the fourth FET device ($Q_4$). However, the control circuit 48 may be connected, either directly or indirectly, to apply the bias voltage from the control circuit 48 at any one, more than one, or all of the drain contacts, D and/or source contacts, S to provide the appropriate bias voltages. Different connections between the control circuit 48 and FET device stack 34 may be advantageous or disadvantageous for different reasons. Sensitivity to turn-on times may be considered when determining the particular circuit topology for connecting the control circuit 48 with the FET device stack 34. Also, loading effects may be considered for the particular application. For example, the paths that connect the control circuit 48 to the drain contact, D of the first FET device ($Q_1$) and the source contact, S, of the fourth FET device ($Q_4$) have resistors, $R_s$ and $R_d$, which present a load to the first end 38 and second end 44 of the FET device stack 34, respectively. Resistors, $R_s$ and $R_d$, may be advantageous to reduce distortion but may also cause leakage currents. Also, different types of filtering devices (not shown) and the like may connected between the control circuit 48 and the FET device stack 34 to prevent the time-variant input signal 42 from leaking into and damaging the control circuit 48. These and other circuit topologies for connecting the control circuit 48 to the FET device stack 34 would be apparent to one of ordinary skill in the art in light of this disclosure.

Referring again to FIG. 2, the control circuit 48 applies a second voltage to the drain contact, D of the first FET device ($Q_1$) and the source contact, S, of the fourth FET device ($Q_4$) during the closed state. The second voltage should be less than the first voltage but non-negative relative to the reference voltage. In this embodiment, the second voltage is the same as the reference voltage, which in this case is ground; however, in other embodiments, higher voltages having a voltage level between the reference voltage and the first voltage may be selected. By applying the second voltage at the drain contact, D of the first FET device ($Q_1$) and the source contact, S, of the fourth FET device ($Q_4$), the drain contacts, D, and source contacts, S of each of the plurality of FET devices 32 become biased at the second voltage. During the closed state, the gate contacts, G, of each of the plurality of FET devices 32 are biased at the first voltage relative to the source contacts, S, which are at ground. As a result, the gate contacts, G, are biased above the reverse biased pinch-off voltage, ($-V_p$), relative to the source contacts, S and the FET device stack 34 operates in the closed state.

The control circuit 48 is also operable to place the FET device stack 34 in the open state by biasing the gate contacts, G, of the plurality of FET devices 32 at the second voltage (in this case ground) relative to a reference voltage (in this case ground). Also, the control circuit 48 applies a bias at the first voltage at the first end 38 to the drain contact, D, of the first FET device ($Q_1$) and at the second end 44 to the source contact, S, of the fourth FET device ($Q_4$). In the illustrated embodiment, the first voltage is at, $+V_{bias}$, and may be around 2.5 Volts. This in turn causes the drain contacts, D, and source contacts, S, of each of the plurality of FET devices 32 to be positively biased at the first voltage, $+V_{bias}$, relative to the reference voltage. As discussed above, the second voltage of the illustrated embodiment is the same as reference voltage, which is ground, and thus the gate contacts, G, of each of the plurality of FET devices 32 are biased at zero (0) volts relative to ground. Notice that while each of the gate contacts, G, of the plurality of FET devices 32 are non-negatively biased relative to the reference voltage, the gate contacts, G, are negatively biased at $-V_{bias}$ relative to the drain contacts, D, and the source contacts, S. By selecting the magnitude of, the first voltage, $+V_{bias}$, with respect to the pinch-off voltage, in this case, ($-V_p$), the first voltage creates a buffer that prevents the time-variant input signal 42 from forcing the FET device stack 34 out of the open state. This buffer can be expressed as the first voltage $+V_{bias}$ plus the pinch-off voltage, ($-V_p$), as shown below:

$$V_{buffer} = +V_{bias} + (-V_p)$$

Since the time-variant input signal 42 must cause a voltage greater than $+V_{bias\ +}(-V_p)$, at the gate contacts, G, to turn on the FET devices ($Q_1$-$Q_4$), a buffer of $V_{buffer} = +V_{bias\ +}(-V_p)$ is provided that prevents the FET device stack 34 from being forced out of the open state. The FET devices 32 may have similar activation and impedance characteristics between the gate contact, G and the drain contact, D, and the gate contact, G, and the source contact, S and thus the drains and sources of the FET devices are congruent. In this case, biasing the drain contact, D, of the FET devices 32 also provides a buffer of $+V_{bias\ +}(-V_p)$ that prevents the drain to gate of the FET devices 32 from being activated in the open state of the FET device stack 34. The FET devices 32 may have similar activation and deactivation characteristics between the gate contact, G and the drain contact, D, and the gate contact, G, and the source contact, S and thus the drains and sources of the FET devices are congruent. As a result, biasing the drain contact, D, of the FET devices 32 also provides a buffer of $+V_{bias\ +}(-V_p)$ that prevents the drain to gate of the FET devices 32 from being activated in the open state of the FET device stack 34. If, in the alternative, the drain and source of one or more of the FET devices 32 are not congruent with one another, then the buffer may be different between the gate contact, G, and the drain contact, D, and the source contact, S, and the gate contact, G, of the FET device 32.

For depletion mode type FET devices 32, the buffer is less than the magnitude of the first voltage, $+V_{bias}$. However, for enhancement mode type FET devices 32, the buffer is greater than the magnitude of $+V_{bias}$, i.e. $V_{buffer} = +V_{bias\ +}(+V_p)$. Note that a buffer, $V_{buffer}$, is provided by the control circuit 48 without requiring the use of a negative voltage source, such as a negative-charge pump. In addition, the bias swing from the open state to the closed state and vice versa at the gate contacts, G, of each of the plurality of FET devices is only the first voltage minus the second voltage. In this case, the first voltage is at $+V_{bias}$ and the second voltage is at ground and thus the bias swing created by the control circuit is only $|V_{bias}|$. Since the voltage swing is not greater than $|V_{bias}|$, transition states are not needed to prevent the voltage between the drain and gate contacts, D, G, of the FET devices 32 from exceeding the voltage handling capabilities of the FET devices 32 when transitioning to and from the open and closed states. In the illustrated embodiment of FIG. 2, the plurality of FET devices 32 have essentially the same characteristics. However, this is not necessarily the case, and in other embodiments, each or some of the plurality of FET devices 32 may be of different types having different characteristics. In these alternative embodiments, the first voltage, $+V_{bias}$, should be selected accordingly to place FET device stack 34 in the open state and provide the appropriate buffer without causing excessive bias swings.

The plurality of FET devices 32 in the stacked FET switch 30 of FIG. 2 each have a body and a body contact, B, to bias the body of the FET device 32. The body contacts, B, of the plurality of FET devices 32 are biased to a bias voltage, in this case ground, whether the FET device stack 34 is in the open state or in the closed state. Biasing the body contact, B, of the plurality of FET devices 32 may be utilized to help define the voltages in the bodies of the plurality of FET devices 32 and reduce distortion. However, in the alternative, the plurality of FET devices 32 may not have body biasing. Alternative embodiments may have floating body designs even if the FET devices 32 are the type of FET devices 32 that require a negative bias between the transistor bodies and the drain and source contacts, D, S, to prevent the activation of reverse-body diodes when the FET device stack 34 is operating in the open state. While the body contacts, B, of the plurality of FET devices 32 in FIG. 2 are always biased to ground, the drain contacts, D, and source contacts, S, are biased to the first voltage, $+V_{bias}$, during the open state. Thus, the voltage bias seen between the body contacts, B, and the drain and source contacts, D, S, is a negative voltage, in this case $-V_{bias}$. Accordingly, a negative voltage is presented at the body contacts, B, relative to the drain and source contacts, D, S, without requiring a negative voltage source, such as a negative-voltage generator. As a result, the floating body topologies may be utilized even if the FET devices 32 are the type of FET devices 32 that require a negative bias to prevent the activation of reverse-body diodes.

As mentioned above, the control circuit 48 of FIG. 2 is operably associated with the gate contacts, G, and the drain contact, D, of the first FET device ($Q_1$) and the source contact, S, of the fourth FET device ($Q_4$) to provide the appropriate bias voltages relative to the reference voltage. The bias voltage at the gate contacts, G, is referred to as $V_G$ while the bias voltage at the drain contact, D, of the first FET device ($Q_1$) and the source contact, S, of the fourth FET device ($Q_4$) is referred to as $V_{stack}$. The bias voltages, $V_G$, and $V_{stack}$ are presented in the Table I below.

| Switch State | $V_G$ | $V_{stack}$ |
|---|---|---|
| Open State | Second Voltage | First Voltage |
| Closed State | First Voltage | Second Voltage |

As mentioned above, the first voltage is positive relative to the reference voltage. The second voltage is non-negative relative to the reference voltage and lower than the first voltage. For the illustrated embodiment discussed above for FIG. 2, the specific bias voltages $V_G$, $V_{stack}$ are shown in the Table II below.

| Switch State | $V_G$ | $V_{stack}$ |
|---|---|---|
| Open State | Ground | $+V_{bias}$ |
| Closed State | $+V_{bias}$ | Ground |

The control circuit 48 of the stacked FET switch 30 may be configured in any manner to provide the above mentioned bias voltages, $V_G$, and $V_{stack}$ in Tables II, III. The control circuit 48 may include, without limitation, logic controllers, sequential controllers, feedback controllers, and/or linear controllers. These and other control topologies would be apparent to one of ordinary skill in the art, as a result of this disclosure. The control circuit 48 may also receive and transmit control signals and/or have internal programming and memory to determine when to switch the FET device stack 34 to and from the open and the closed states. In addition, while the DC voltage source 50 is included within the illustrated embodiment of the control circuit 48, in other embodiments, the control circuit 48 may simply connect to an external voltage source(s) to provide the appropriate bias voltage.

As shown by Tables II and III, the stacked FET switch 30 described in FIG. 2 does not require transition states when switching to and from the open state and the closed state. However, other embodiments may require transition states to prevent excessive loading of the FET devices 32 or to function appropriately with external devices. Thus, the control topology of the control circuit 48 may vary in accordance with the particular application for the stacked FET switch 30. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case ground), the second voltage may have a small negative difference between around (−0.1 V to −0.2V) relative to the reference voltage.

Note that the input terminal 40 and the output terminal 46 in the stacked FET switch 30 may be RF ports having RF voltages, $V_{in}$ and $V_{out}$. In this case, the FET device stack 34 may be coupled in series within an RF line. Thus, the reference voltage would be the network voltage, $V_{out}$, of the RF line at the output terminal 46. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case $V_{out}$), the second voltage may have a small negative difference between around (−0.1 V to −0.2V) relative to the reference voltage. In any case, the small negative difference needs to have a magnitude less than 10% of the magnitude of the first voltage relative to the reference voltage.

In this embodiment, the reference voltage for measuring the first and second voltage of Table II above is at $V_{out}$, which has been externally coupled to ground. In alternative embodiments however, this may not be the case. The second voltage should be higher than the reference voltage, $V_{out}$, and non-negative relative to the reference voltage, $V_{out}$. Thus, $V_{out}$ may be a negative voltage with respect to ground, since ground should be higher and non-negative with respect to the reference voltage, $V_{out}$. In this manner, the second voltage may be non-negative relative to the reference voltage, $V_{out}$, even though the second voltage is negative relative to the ground.

Next, the illustrated control circuit 48 includes the DC voltage source 50, the first switch 52, the second switch 54, and the bias control device 56. The positive terminal of the DC voltage source 50 provides the first voltage, $+V_{bias}$, and the grounded terminal provides the second voltage at ground. Connected to the positive terminal and the negative terminal of the DC voltage source 50 are the first switch 52 and second switch 54, which are operated by the bias control device 56. The first switch 52 connects to the gate contacts, G, of the plurality of FET devices 32 to provide the bias voltage, $V_G$ at the gate contacts, G. The second switch 54 is connected to the drain contact, D, of the first FET device ($Q_1$) and the source contact, S, of the fourth FET device ($Q_4$) to provide the bias voltage, $V_{stack}$. The bias control device 56 controls the first switch 52 and the second switch 54, in accordance with Table III above to switch the FET device stack 34 into and out of the open and closed states.

To ensure that the time-variant input signal 42 is more evenly distributed across the FET device stack 34, the stacked FET switch 30 includes a first capacitor 58 and a second capacitor 60. The first and second capacitors 58, 60 also maintain the FET devices 32 in the FET device stack 34 appropriately biased in accordance with Table III during the open and closed states and operate as a DC block to help isolate the biasing from the control circuit 48 to the FET device stack 34. In alternative embodiments, other DC blocking devices may be utilized, such as active and passive filtering circuits, or the like.

The first capacitor 58 is connected in series between the drain contact, D, of the first FET device ($Q_1$) and the input terminal 40. The second capacitor 60 is connected in series between the source contact, S, of the fourth FET device ($Q_4$) and the output terminal 46. Accordingly, the stacked FET switch 30 may be useful in building programmable capacitor arrays (not shown). As is known in the art, programmable capacitor arrays, also known as digitally tunable capacitors, contain switches that open and close paths to different capacitors and thereby vary the capacitance of the programmable capacitor array. These programmable capacitor arrays are often utilized in RF circuits, such as antenna tuners. The stacked FET switch 30 in FIG. 2 already has the first capacitor 58 and the second capacitor 60 coupled in series between the input terminal 40 and the first end 38 to help distribute the time-variant input signal 42 more evenly across the FET device stack 34 and provide a DC block. If a plurality of stacked FET switches, each like the stacked FET switch 30 in FIG. 2, were utilized and coupled accordingly, then the first capacitor 58 and the second capacitor 60 in each of the plurality of stacked FET switches could also provide the capacitance for the programmable capacitor array without any additional overhead or loss. Thus, proper calibration of the first capacitor 58 and the second capacitor in an array of stacked FET switches, each like the stacked FET switch 30 in FIG. 2, may allow one or more control circuits 48 to vary the capacitance of the programmable capacitor array by selecting which of the stacked FET switches to open and close.

The stacked FET switch 30 shown by FIG. 2 includes a resistive circuit 62 that is coupled to the gate contacts, G, of the plurality of FET devices 32. In this embodiment, the resistive circuit 62 includes a common resistor, $R_{g\_common}$, and resistors, $R_g$, coupled in series to each one of the gate contacts, G. The resistive circuit 62 should present a high resistance at each of the gate contacts, G, relative to an impedance of the parasitic capacitances between the gates and the drains and sources of the plurality of FET devices 32, such that the parasitic capacitances are rendered negligible at the frequency of interest. In this manner, the resistive circuit 62 does not load the FET device stack 34 and the FET device stack 34 reduces distortion while preserving bandwidth. Other alternative circuit topologies may be utilized to provide the high resistance. For example and without limitation, all of the high resistance may be provided by a single resistor, such as, $R_{g\_common}$, or alternatively, $R_{g\_common}$, may not be provided at all. Active devices, such as transistors, may also be utilized. These and other circuit topologies for the resistive circuit 62 would be apparent to one of ordinary skill in the art, in light of this disclosure.

Next, the embodiment of the stacked FET switch 30 in FIG. 2 has a distribution network having a resistor, $R_{ds}$ connected across each of the drain contacts, D, and source contacts, S. These resistors, $R_{ds}$, may be sized to help handle power dissipation and provide impedance matching for impedances within the FET devices 32. This distribution may be done in conjunction with the parasitic coupling afforded by the parasitic capacitances of the FET devices 32 between the gate to source, gate to drain, body to source, gate to body, and/or body to drain. These parasitic capacitances may occur at high frequencies above the high pass filter poles of the stacked FET switch 30. Other circuit components, such as capacitors, may also couple across the drain contacts, D, and source contacts, S, to help ensure a more even distribution of the time-variant input signal 42 across the FET device stack 34. The capacitors may be implemented utilizing metal-insulator-metal (MIM) capacitors or parasitic capacitors if desired.

The stacked FET switch 30 may also include a resistive circuit 64 coupled to the body contacts, B, of the plurality of FET devices 32. The resistive circuit 64 includes a resistor, $R_{b\_common}$ and a resistor, $R_b$, coupled in series with each of the plurality of body contacts, B. The resistance presented by the resistive circuit 64 at the body contacts, B, may be high relative to the parasitic capacitances between the bodies of the plurality of FET devices 32 and the source and drain contacts, S, D at the frequency of interest. Other alternative circuit topologies provide the high resistance at the body terminals, B. For example and without limitation, all of the high resistance may be provided by a single resistor, such as, $R_{b\_common}$ or alternatively, $R_{b\_common}$ may not be provided at all. Active devices, such as transistors, may also be utilized. These and other circuit topologies for the resistive circuit would be apparent to one of ordinary skill in the art, as a result of this disclosure.

It should be noted that, if the FET devices 32 are CMOS type transistors built having a deep nwell, it may be desirable for the bias voltage at the body contacts, B, to be greater than the reference voltage to help avoid the activation of parasitic diodes under large signal conditions. To do this, the body contacts, B, may be coupled to the positive terminal of the DC voltage source, 50, or to another internal or external voltage source, instead of ground. In other embodiments, the bodies of the FET devices 32 may be left floating and the deep nwell may be biased through a high value resistor to allow the deep nwell to self-bias under large signal conditions.

Figure 3:
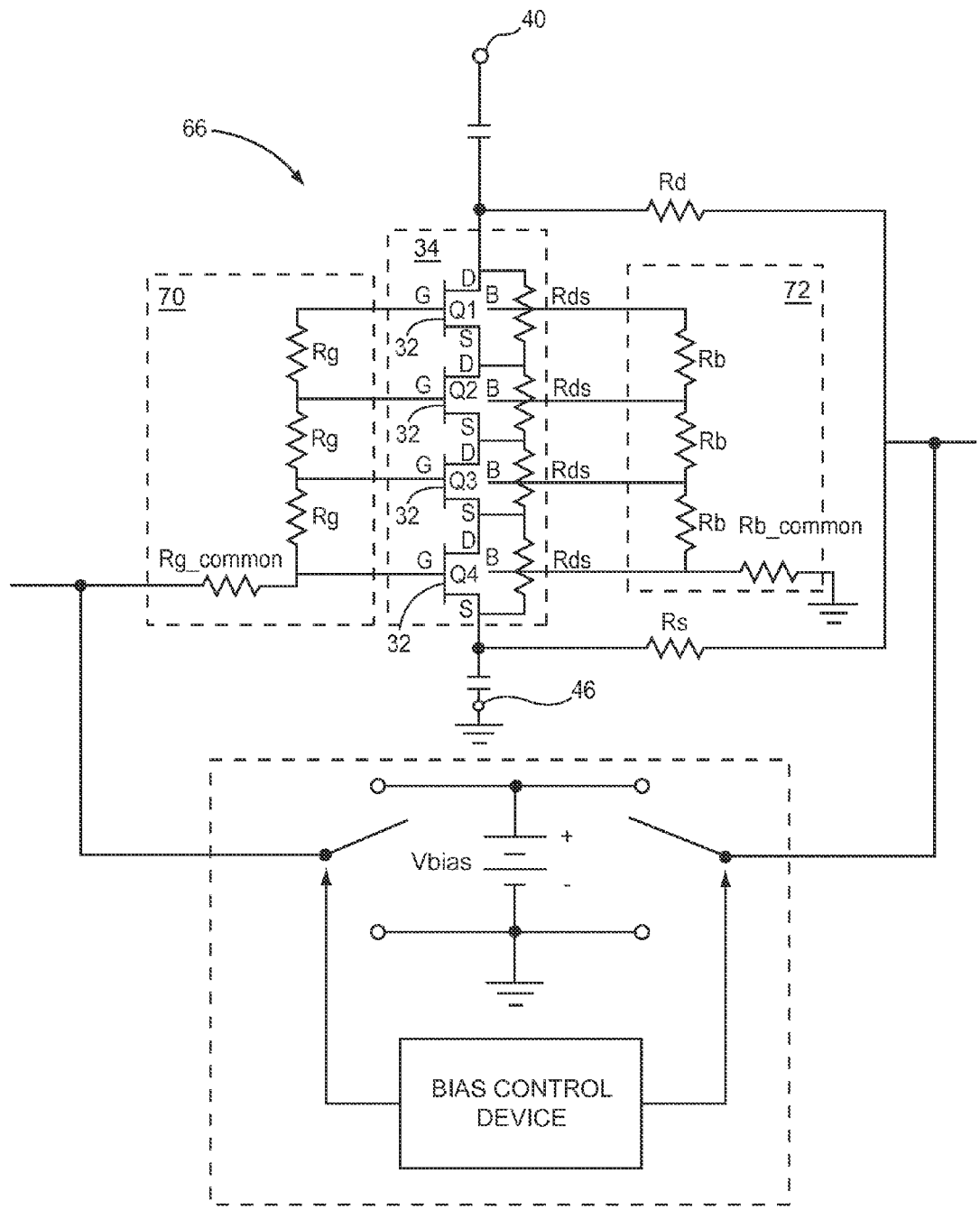
FIG. 3 illustrates another embodiment of a stacked FET switch in accordance with this disclosure.

FIG. 3 illustrates another embodiment of a stacked FET switch 66. The stacked FET switch 66 is substantially similar to the stacked FET switch 30 described above in FIG. 2, except for the circuit topology of the resistive circuit 70, coupled to the gate contacts, G, and the circuit topology of the resistive circuit 72, coupled to the body contacts, B. In this embodiment, the resistors, $R_g$, are each coupled between the gate contact, G, of one of the FET devices 32, and the gate contact, G, of another one of the FET devices 32. Similarly, each of the resistors, $R_b$, are coupled between the body contact, B, of one of the FET devices 32, and the body contact, B, of another one of the FET devices 32. The circuit topology for the stacked FET switch 66 may be desirable, if the stacked FET switch 66 is being utilized to shunt or is provided in series with an RF line of an RF circuit. One benefit of the illustrated topology of resistive circuits 70, 72 is that the open state loading of the resistors, $R_g$, and $R_b$, may be substantially reduced. As a result, the circuit topology of resistive circuits 70, 72 allows resistors $R_g$, and $R_b$ to be substantially reduced in size.

Note that the embodiment that the output terminal 46 is connected directly to ground. In this manner, the input terminal 40 may couple the FET device stack 34 in shunt with an RF line so that the stacked FET switch 66 shunts the RF line. Alternatively, the stacked FET switch 66 could also connect the FET device stack 34 in series in the RF line, as discussed above for the embodiment illustrated in FIG. 2.

Figure 4:
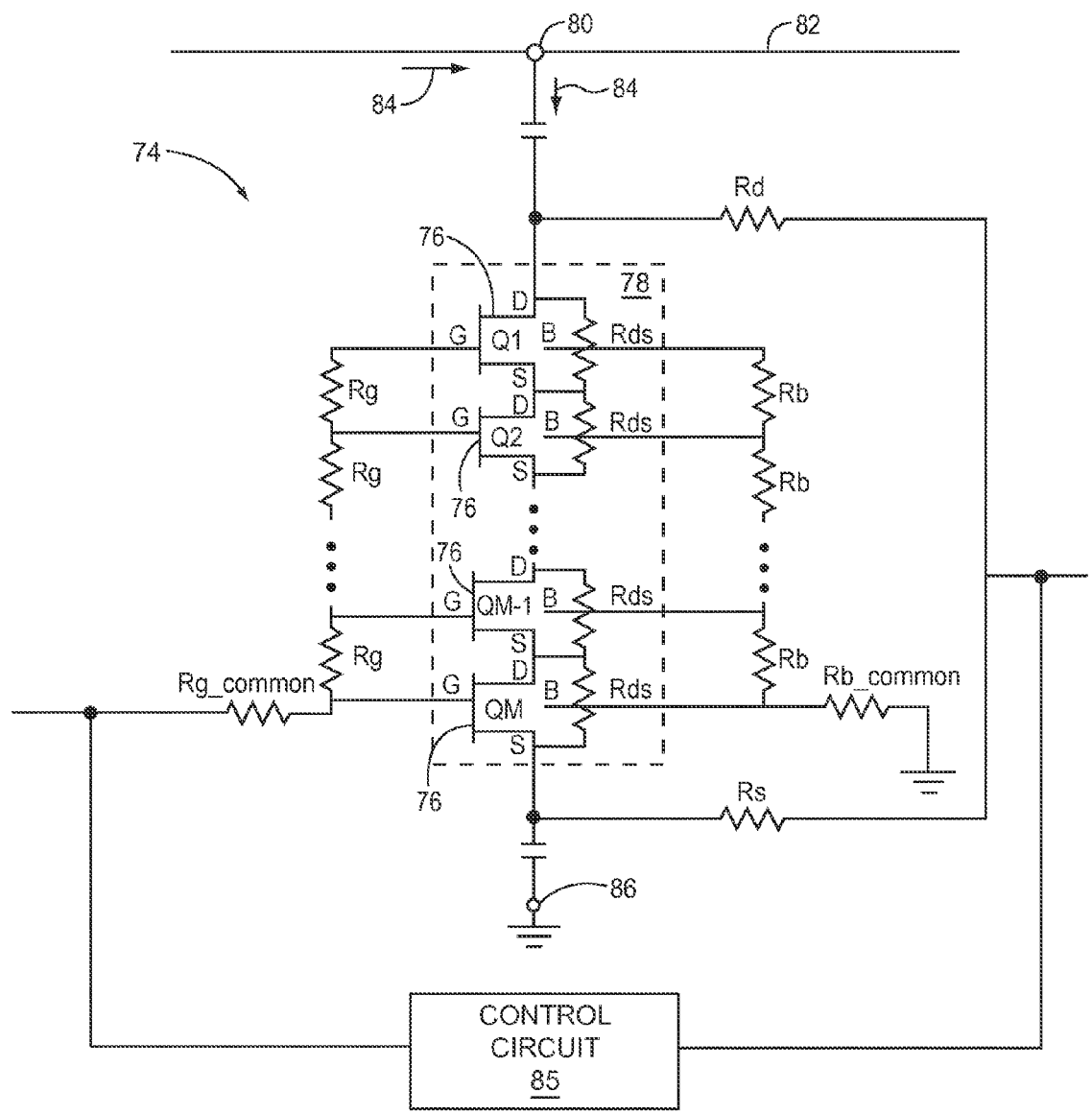
FIG. 4 illustrates yet another embodiment of a stacked FET switch in accordance with this disclosure.

Referring now to FIG. 4, a stacked FET switch 74 may have any plurality of FET devices (referred to generically as elements 76 and to a specific FET device as elements $Q_1$-$Q_M$) coupled in series to form an FET device stack 78. Thus, the FET device stack 78 is stacked from a first FET device ($Q_1$) to a last FET device ($Q_M$), where the number, M, of FET devices 76 may be any integer greater than 1. In the illustrated embodiment, the stacked FET switch 74 has an input terminal 80 connected to a signal line 82 that transmits a time-variant input signal 84, such as an RF signal. During the closed state, the FET device stack 78 shunts the signal line 82 and transmits the time-variant input signal 84 to the output terminal 86, which is connected to a reference voltage, in this case ground. In the open state, the FET device stack 78 prevents the time-variant input signal 84 from being shunted to ground. A control circuit 85 provides a first voltage and second voltage, in accordance with Table III, which is discussed above.

Figure 5:
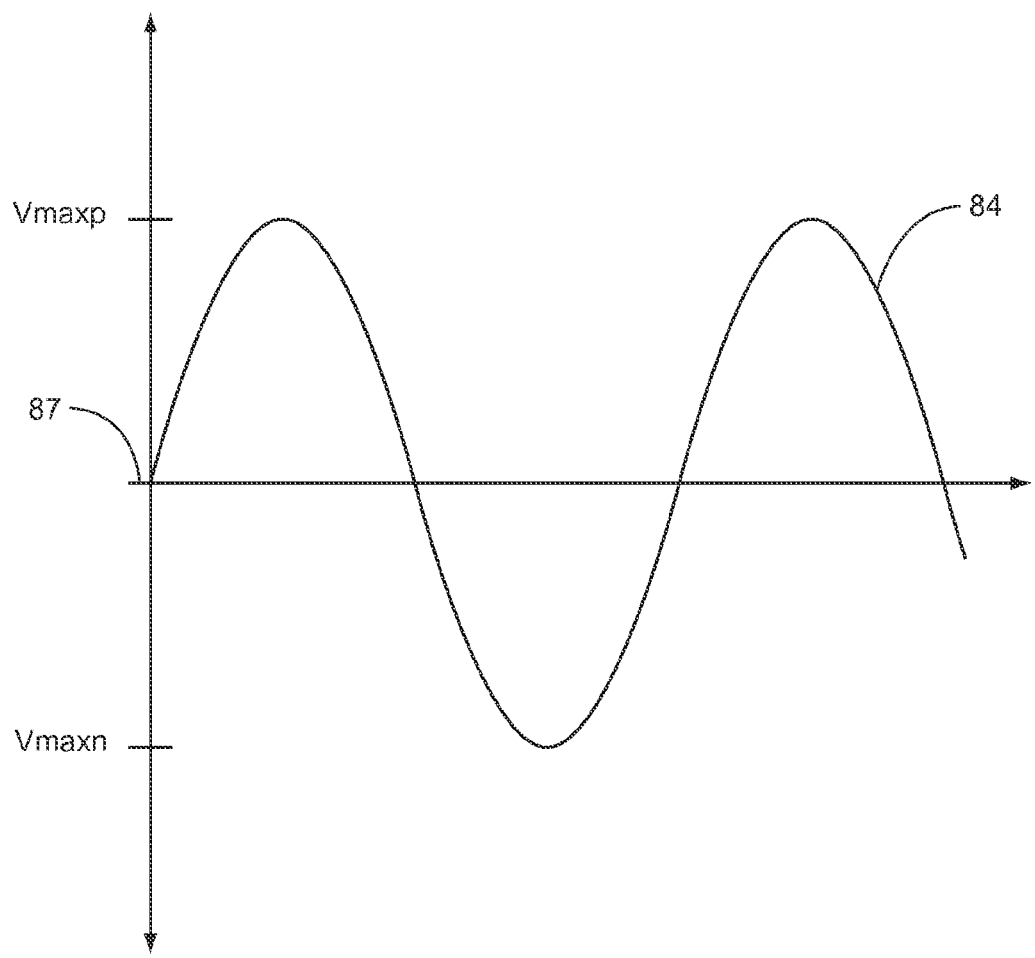
FIG. 5 illustrates one embodiment of a time-variant input signal for the stacked FET switch in FIG. 4.

Referring now to FIGS. 4 and 5, one type of time-variant input signal 84 is illustrated. The time-variant input signal 84 illustrated is a sinusoidal voltage having a maximum positive peak voltage, $V_{maxp}$, and a minimum negative peak voltage $V_{maxn}$, relative to a reference voltage, 87, in this case ground. The time-variant input signal 84 is illustrated as a simplified sinusoidal voltage to help with the discussion of the stacked FET switch 74. Accordingly, the maximum positive peak voltage, $V_{maxp}$, and the minimum negative peak voltage $V_{maxn}$ have the same magnitude. Thus, the maximum peak voltage may be referred to as a maximum peak voltage, $V_{max}$. However, the time-variant input signal 84 may be any type of signal, such as, for example an RF signal, in which the time-variant input signal 84 would be more complex or even simpler than the signal shown in FIG. 5, may actually consist of a plurality of combined signals, and may not be symmetrical. For example, the maximum positive peak voltage, $V_{maxp}$, and the minimum negative peak voltage $V_{maxn}$ may be different for positive and negative cycles. Some time-variant input signals 84 may not have either a positive or a negative cycle and thus may be unicyclical and others may actually not be periodic at all. These and other considerations should be taken into account when determining maximum peak voltage, $V_{max}$ as would be apparent to one of ordinary skill in the art, as a result of this disclosure.

The plurality of FET devices 76 each be associated with a reverse biased pinch-off voltage, $(-V_p)$ and a breakdown voltage, $-V_{Break}$. The pinch-off voltage, $(-V_p)$, of a depletion mode FET device 76 is the reverse bias voltage at the gate contact, G, relative to a voltage of the source contact, S, at which the FET device 76 is opened. If a reverse bias less than or equal to the pinch-off voltage, $(-V_p)$, is applied between the gate contact, G, and the source contact, S, of the FET device 76, a channel of the FET device 76 is pinched off and the FET device 76 is deactivated. If the FET devices have congruent drains and sources, the pinch-off voltage, $(-V_p)$, is applicable to the activation voltage from the gate contact, G, to the source contact, S for the FET device 76, as well. The breakdown voltage, $-V_{Break}$, is the voltage between the drain contact, D, and the gate contact, G at which the FET device 76 begins to conduct when in the open state. In other words, if a negative voltage equal to or greater than the breakdown voltage, $-V_{Break}$, is applied between the drain contact, D, and the gate contact, G, the FET device 76 breaks down and begins to conduct. In FIG. 4, the plurality of FET devices 76 all have essentially the same characteristics and thus are associated with the same pinch-off voltage, $(-V_p)$, and breakdown voltages, $-V_{Break}$. However, as discussed above, in other embodiments, the characteristics of the FET devices 76 may be different and thus each may be associated with different pinch-off voltages and/or breakdown voltages.

Figure 6:
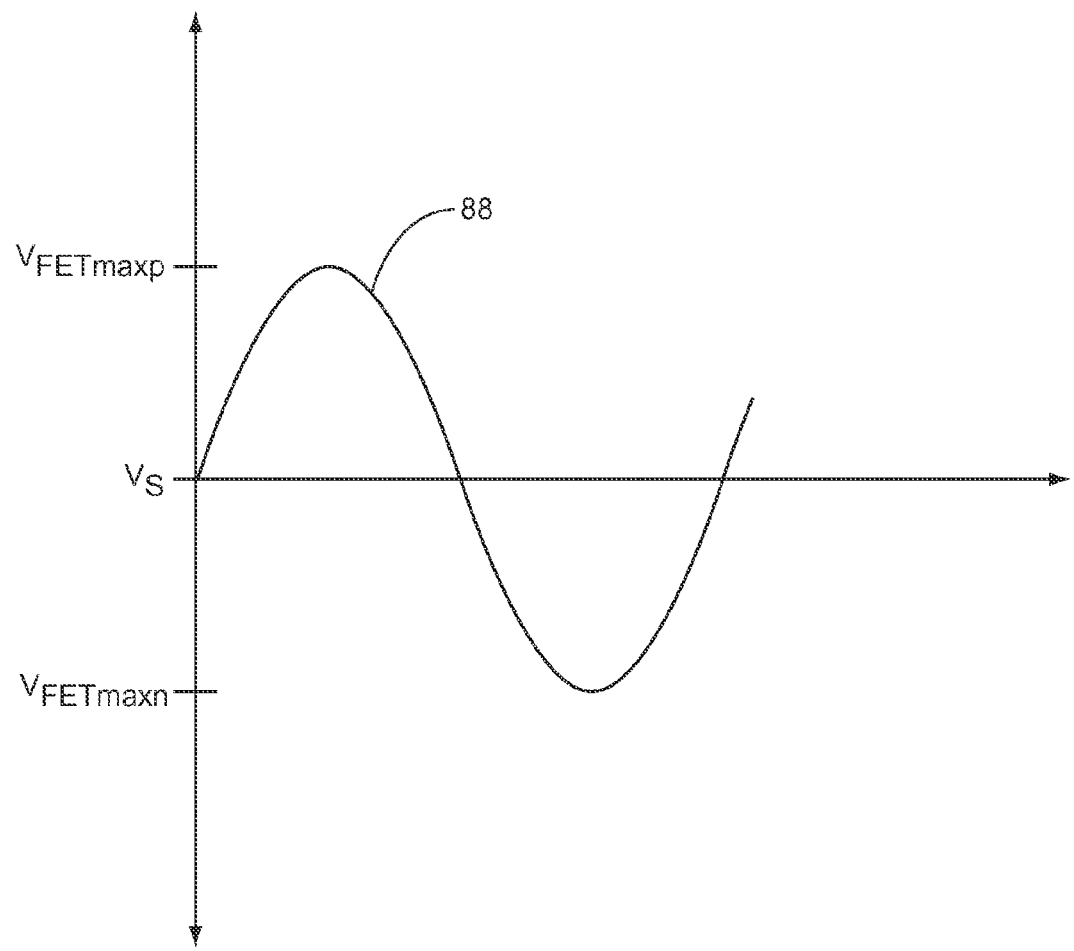
FIG. 6 illustrates a voltage at each of the drain contacts relative to the source contacts when an FET device stack in FIG. 4 is in an open state.

Referring now to FIGS. 4 and 6, FIG. 6 is a graph of a voltage signal 88 at the drain contacts, D of each of the FET devices 76 relative to the source contact, S, of the FET device 76 during the open state of the FET device stack 78. Note that this is relative to the source contact, S, and not to ground. The voltage signal for each of the drain contacts, D, relative to ground is clearly different for each of the FET devices 76. FET devices 76 positioned higher in the stack would have a drain voltage with greater positive and negative voltage peaks relative to ground. The drain voltage of the first FET device ($Q_1$) relative to ground would be essentially the same as the time variant input signal 84 (shown in FIG. 5) plus a biasing voltage, $+V_{bias}$, while the drain voltage of the last FET device ($Q_M$) would be essentially the same as the voltage signal 88 relative to ground plus the biasing voltage, $+V_{bias}$. However, since the time-variant input signal 84 may be evenly distributed across each of the FET devices 76, the drain voltages are relatively uniform with respect to their source contact, S. Also, the biasing voltage, $+V_{bias}$, cancels out for voltage signal 88 since both of the drain contact, D, and the source contact, S, are biased by the biasing voltage, $+V_{bias}$ during the open state.

As illustrated, the voltage signal 88 has a maximum positive peak voltage, $V_{FETmaxp}$, and the minimum negative peak voltage $V_{FETmaxn}$ and thus the maximum peak voltage is $V_{FETmax}$. The relationship between $V_{max}$ and $V_{FETmax}$ can be expressed as:

$$V_{FETmax} = \frac{V_{max}}{M}$$

Figure 7:
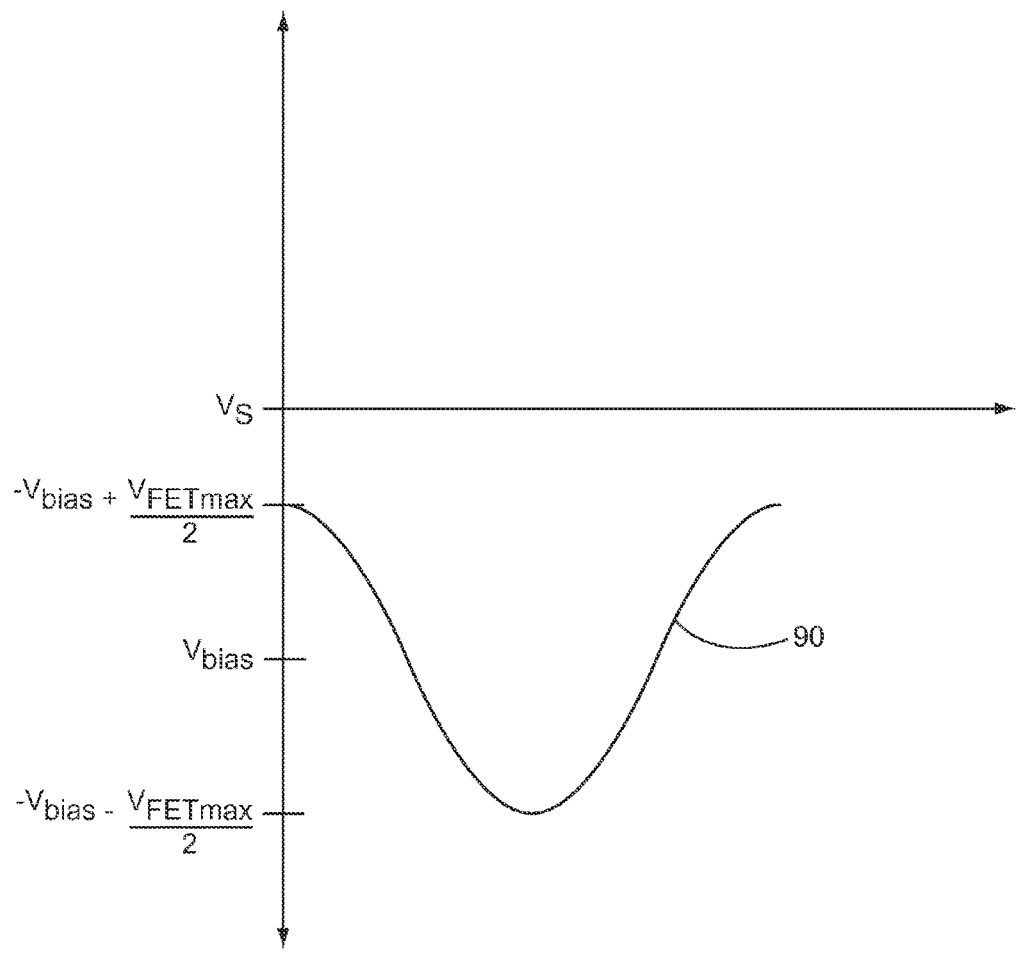
FIG. 7 illustrates a voltage of each of the gate contacts relative to the source contacts when the FET device stack in FIG. 4 is in the open state.

Referring now to FIG. 4 and FIG. 7, FIG. 7 illustrates a voltage signal 90 at the gate contact, G, of each of the plurality of FET devices 76, relative to the source contact, S, of the FET device 76 during the open state. For each of the FET devices 76 shown in FIG. 4, half of the voltage drop for the voltage signal 88 (shown in FIG. 6) occurs between the drain contact, D, and the gate contact, G, and the other half occurs between the gate contact, G, and the source contact, S, if we assume that the drains and sources of the FET devices 76 are congruent and have substantially the same impedance characteristics. Note that the gate contact, G, of each of the plurality of FET devices 76 appears negatively biased at, $-V_{bias}$, since the drain and source contacts, D, S, of each of the FET devices 76 are positively biased by the first voltage, $+V_{bias}$. Consequently, the voltage signal 90 is centered at the negative bias, $-V_{bias}$, and has a maximum positive-cycle peak voltage, $$-V_{bias} + \frac{V_{FETmax}}{2},$$

and a maximum negative-cycle peak voltage, $$-V_{bias} - \frac{V_{FETmax}}{2}.$$

To maintain the FET devices 76 in the open state, the voltage signal 90 must not be greater than the reverse-biased pinch-off voltage, $(-V_p)$, during the positive cycle. The upper limit of the maximum peak voltage, $$-V_{bias} + \frac{V_{FETmax}}{2},$$

can thus be expressed as:

$$-V_{bias} + \frac{V_{FETmax}}{2} = (-V_p)$$

Since the voltage between the drain contacts, D, and the gate contacts, G, at the minimum peak voltage, $$-V_{bias} - \frac{V_{FETmax}}{2},$$

cannot exceed the negative breakdown voltage, $-V_{Break}$, the lower limit of the minimum peak voltage, $$-V_{bias} - \frac{V_{FETmax}}{2},$$

as seen from gate to drain, can be expressed as:

$$-V_{bias} - \frac{V_{FETmax}}{2} = -V_{Break}$$

From these two equations, the highest allowable value of the maximum peak voltage, $V_{FETmax}$, can be solved as $$V_{FETmax} = |V_{Break}| + (-V_p)$$

Also, from the two equations, we can also solve for the magnitude of the first voltage, $+V_{bias}$, relative to ground which may be expressed as:

$$|V_{bias}| = \frac{|V_{break}| + (-V_p)}{2}$$

If the maximum peak voltage, $V_{max}$, of the time-variable input signal 84 is reaches a maximum voltage, $V_{pk}$, then the number, M, of FET devices 76 needed to safely utilize the FET device stack 78 be expressed as:

$$M \geq \frac{V_{pk}}{(|V_{break}| + (-V_p))}$$

The number M of FET devices 76 thus may determine the maximum rated voltage that can be handled by the FET device stack 78.

It should be noted that the equations shown above are estimations for the described values of the stacked FET switch 74 illustrated in FIG. 4. In actual practice, these values may vary from the aforementioned equations as a result of non-ideal behavior of the electronic components in the stacked FET switch 74. In other embodiments, the relationships described by the aforementioned equations may be different depending on the particular circuit topology and electronic components utilized for the stacked FET switch 74. For example, the aforementioned equations have been determined under the assumption that the FET devices 76 are depletion mode type FET devices 76. However, enhancement mode type FET devices 76 may also be utilized in the stacked FET switch 74. One of ordinary skill in the art would be able to reformulate the relationships expressed by the aforementioned equations in accordance with non-ideal circuit behavior and the particular circuit topology and electronic components utilized to form the stacked FET switch 74 in light of this disclosure.

Those skilled in the art will recognize improvements and modifications to the embodiments of the present disclosure. All such improvements and modifications are considered within the scope of the concepts disclosed herein and the claims that follow.

What is claimed is:

1. A stacked FET switch comprising:
   a field effect transistor (FET) device stack that is operable in an open state and in a closed state, the FET device stack comprising a plurality of FET devices coupled in series to form the FET device stack, each of the plurality of FET devices having a gate contact, a drain contact, and a source contact;
   a control circuit operably associated with the FET device stack, the control circuit being configured to:
      bias the gate contact of each of the plurality of FET devices at a first voltage and bias the drain contact and the source contact of each of the plurality of FET devices at a second voltage such that the FET device stack operates in the closed state;
      the first voltage being positive relative to a reference voltage;
      bias the gate contact of each of the plurality of FET devices at the second voltage and bias the drain contact and the source contact of each of the plurality of FET devices at the first voltage, such that the FET device stack operates in the open state; and
      the second voltage being lower than the first voltage and substantially non-negative relative to the reference voltage.

2. The stacked FET switch of claim 1 wherein the second voltage is the same as the reference voltage.

3. The stacked FET switch of claim 1 wherein the second voltage is non-negative relative to the reference voltage.

4. The stacked FET switch of claim 1 wherein:
   each of the plurality of FET devices are a type of FET device that is associated with a breakdown voltage and a pinch-off voltage; and
   a magnitude of the first voltage can be estimated by dividing a magnitude of the breakdown voltage associated with the plurality of FET devices plus the pinch-off voltage associated with the plurality of FET devices by two.

5. The stacked FET switch of claim 1 further comprising:
   an input terminal; and
   an output terminal, wherein the FET device stack is coupled between the input terminal and the output terminal.

6. The stacked FET switch of claim 5, wherein:
   the plurality of FET devices comprise at least a first FET device and a second FET device, the drain contact of the first FET device being at a first end of the FET device stack and the source contact of the second FET device being at a second end of the FET device stack; and
   the stacked FET switch further comprises:
      a first capacitor coupled in series between the input terminal and the drain contact of the first FET device; and
      a second capacitor coupled in series between the source contact of the second FET device and the output terminal.

7. The stacked FET switch of claim 5 wherein:
   each of the plurality of FET devices are a type of FET device that is associated with a breakdown voltage and a pinch-off voltage;
   the FET device stack is adapted to receive a time-variant input signal having a peak voltage relative to the reference voltage, wherein the plurality of FET devices in the FET device stack are greater or equal to in number than the peak voltage divided by a magnitude of the breakdown voltage plus the pinch-off voltage associated with each of the plurality of FET devices.

8. The stacked FET switch of claim 1 further comprising a resistive circuit coupled to the gate contact of each of the plurality of FET devices, the resistive circuit providing a high resistance at the gate contact of each of the plurality of FET devices so as to render one or more parasitic capacitances associated with the gate contact of each of the plurality of FET devices negligible.

9. The stacked FET switch of claim 1 wherein the control circuit is coupled to the gate contact of each of the plurality of FET devices.

10. The stacked FET switch of claim 9 wherein:
the plurality of FET devices comprise at least a first FET device and a second FET device, the drain contact of the first FET device being at a first end of the FET device stack and the source contact of the second FET device being at a second end of the FET device stack; and
the control circuit is coupled to the drain contact of the first FET device and the source contact of the second FET device.

11. The stacked FET switch of claim 1 wherein the control circuit is coupled to the drain contact or the source contact of one or more of the plurality of FET devices.

12. The stacked FET switch of claim 1 wherein each of the plurality of FET devices has a transistor body.

13. A stacked FET switch comprising:
a field effect transistor (FET) device stack that is operable in an open state and in a closed state, the FET device stack comprising a plurality of FET devices coupled in series to form the FET device stack, each of the plurality of FET devices having a gate contact, a body contact, a drain contact, and a source contact;
a control circuit operably associated with the FET device stack and configured to:
positively bias the gate contact of each of the plurality of FET devices and substantially non-negatively bias the drain contact and the source contact of each of the plurality of FET devices relative to a reference voltage such that the FET device stack operates in the closed state;
positively bias the drain contact and the source contact of each of the plurality of FET devices relative to the reference voltage and substantially non-negatively bias the gate contact of each of the plurality of FET devices relative to the reference voltage, such that the FET device stack operates in the open state; and
a resistive circuit coupled to the body contact of each of the plurality of FET devices, the resistive circuit providing a high resistance at the body contact of each of the plurality of FET devices so as to render one or more parasitic capacitances associated with a transistor body of each of the plurality of FET devices negligible.

14. The stacked FET switch of claim 13 further comprising:
an input terminal for receiving a time-variant input signal that has a maximum peak voltage and a minimum peak voltage; and
an output terminal, wherein the FET device stack is coupled between the input terminal and the output terminal.

15. The stacked FET switch of claim 14 wherein:
the plurality of FET devices comprise at least a first FET device and a second FET device, the drain contact of the first FET device being at a first end of the FET device stack and the source contact of the second FET device being at a second end of the FET device stack; and
the stacked FET switch further comprises:
a first capacitor coupled in series between the input terminal and the drain contact of the first FET device; and
a second capacitor coupled in series between the source contact of the second FET device and the output terminal.

16. The stacked FET switch of claim 14 wherein the control circuit is further configured to non-negatively bias the drain contact and the source contact relative to the reference voltage when the FET device stack operates in the closed state.

17. The stacked FET switch of claim 14 wherein:
each of the plurality of FET devices is a type of FET device that has a breakdown voltage and a pinch-off voltage; and
the control circuit is further configured to positively bias the drain contact and the source contact of each of the plurality of FET devices relative to the reference voltage and substantially non-negatively bias the gate contact of each of the plurality of FET devices relative to the reference voltage, such that the FET device stack operates in the open state, such that, for each of the plurality of FET devices, a gate voltage of the gate contact relative to the drain contact does not exceed the breakdown voltage when the time-variant input signal is at the minimum peak voltage.

18. The stacked FET switch of claim 14 wherein:
each of the plurality of FET devices is a type of FET device that has a breakdown voltage and a pinch-off voltage;
the control circuit is further configured to positively bias the drain contact and the source contact of each of the plurality of FET devices relative to the reference voltage and substantially non-negatively bias the gate contact of each of the plurality of FET devices relative to the reference voltage, such that the FET device stack operates in the open state, such that, for each of the plurality of FET devices, a gate voltage of the gate contact relative to the source contact is higher than the pinch-off voltage when the time-variant input signal is at the maximum peak voltage.

19. The stacked FET switch of claim 13 wherein the resistive circuit coupled to the transistor body of each of the plurality of FET devices is further coupled to a fixed voltage source, such that the resistive circuit is coupled between the fixed voltage source and the transistor body of each of the plurality of FET devices.

20. A stacked FET switch comprising:
a field effect transistor (FET) device stack that is operable in an open state and in a closed state, the FET device stack comprising a plurality of FET devices coupled in series to form the FET device stack, each of the plurality of FET devices having a gate contact, a body contact, a drain contact, and a source contact;
a control circuit operably associated with the FET device stack, the control circuit being configured to:
apply a first bias voltage to the gate contact of each of the plurality of FET devices and apply a second bias voltage to the drain contact and the source contact of each of the plurality of FET devices such that the FET device stack operates in the closed state, wherein the first bias voltage is positive relative to a reference voltage; and
apply the first bias voltage to at least one of the drain contact or the source contact of at least one of the plurality of FET devices and apply the second bias voltage to the gate contact of each of the plurality of FET devices, such that the FET device stack operates in the open state, wherein the second bias voltage is substantially non-negative relative to the reference voltage; and
a resistive circuit coupled to the body contact of each of the plurality of FET devices, the resistive circuit providing a high resistance at the body contact of each of the plurality of FET devices so as to render one or more parasitic capacitances associated with a transistor body of each of the plurality of FET devices negligible.

21. The stacked FET switch of claim 20 wherein the plurality of FET devices are coupled to one another such that applying the first bias voltage to the at least one of the drain contact or the source contact of the at least one of the plurality of FET devices biases the drain contact and the source contact of each of the plurality of FET devices at the first bias voltage.

22. The stacked FET switch of claim 12 further comprising a resistive circuit coupled to the transistor body of each of the plurality of FET devices, the resistive circuit providing a high resistance at the transistor body of each of the plurality of FET devices so as to render one or more parasitic capacitances associated with the transistor body of each of the plurality of FET devices negligible.

23. The stacked FET switch of claim 12 wherein the transistor body of each of the plurality of FET devices is biased at the reference voltage when the FET device stack is in the open state and the closed state.

\* \* \* \* \*

UNITED STATES PATENT AND TRADEMARK OFFICE
CERTIFICATE OF CORRECTION

PATENT NO. : 8,970,278 B2
APPLICATION NO. : 13/095357
DATED : March 3, 2015
INVENTOR(S) : Marcus Granger-Jones and Christian Rye Iversen It is certified that error appears in the above-identified patent and that said Letters Patent is hereby corrected as shown below:

In the Specification

In column 5, line 5, replace "$V_{1n}$" with --$V_{in}$--.

In column 9, line 7, replace "($Q_t$)" with --($Q_1$)--.

Signed and Sealed this
Eighteenth Day of August, 2015

Michelle K. Lee
*Director of the United States Patent and Trademark Office*